US009678445B2

(12) United States Patent
Lafarre et al.

(10) Patent No.: US 9,678,445 B2
(45) Date of Patent: Jun. 13, 2017

(54) SUBSTRATE HOLDER, LITHOGRAPHIC APPARATUS, DEVICE MANUFACTURING METHOD, AND METHOD OF MANUFACTURING A SUBSTRATE HOLDER

(71) Applicant: ASML NETHERLANDS B.V., Veldhoven (NL)

(72) Inventors: Raymond Wilhelmus Louis Lafarre, Helmond (NL); Nicolaas Ten Kate, Almkerk (NL); Nina Vladimirovna Dziomkina, Eindhoven (NL); Yogesh Pramod Karade, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/233,775

(22) Filed: Aug. 10, 2016

(65) Prior Publication Data

US 2016/0349632 A1    Dec. 1, 2016

Related U.S. Application Data

(63) Continuation of application No. 13/323,520, filed on Dec. 12, 2011, now Pat. No. 9,423,699.
(Continued)

(51) Int. Cl.
*G03B 27/52* (2006.01)
*G03B 27/42* (2006.01)
(Continued)

(52) U.S. Cl.
CPC .......... *G03F 7/70975* (2013.01); *C23C 16/44* (2013.01); *G03F 7/707* (2013.01);
(Continued)

(58) Field of Classification Search
CPC ............. C23C 16/0272; H01L 21/6831; H01L 21/0228; H01L 21/3065; H01L 21/67253;
(Continued)

(56) References Cited

U.S. PATENT DOCUMENTS

| 4,480,284 A | 10/1984 | Tojo et al. |
| 5,885,654 A | 3/1999 | Hagiwara et al. |

(Continued)

FOREIGN PATENT DOCUMENTS

| JP | 5-047909 | 2/1993 |
| JP | 2000-311933 | 11/2000 |

(Continued)

OTHER PUBLICATIONS

Japanese Office Action mailed Dec. 5, 2012 in corresponding Japanese Patent Application No. 2011-268667.

*Primary Examiner* — Mesfin Asfaw
(74) *Attorney, Agent, or Firm* — Pillsbury Winthrop Shaw Pittman LLP (57) ABSTRACT

A substrate holder for a lithographic apparatus has a planarization layer provided on a surface thereof. The planarization layer provides a smooth surface for the formation of an electronic component such as a thin film electronic component. The planarization layer may be provided in multiple sub layers. The planarization layer may smooth over roughness caused by removal of material from a blank to form burls on the substrate holder.

20 Claims, 6 Drawing Sheets

Related U.S. Application Data (60) Provisional application No. 61/422,918, filed on Dec. 14, 2010.

(51) Int. Cl.
   *G03F 7/20* (2006.01)
   *H01L 21/687* (2006.01)
   *C23C 16/44* (2006.01)

(52) U.S. Cl.
   CPC ...... *G03F 7/70341* (2013.01); *H01L 21/6875* (2013.01); *Y10T 29/49* (2015.01)

(58) Field of Classification Search
   CPC .......... H01L 21/6833; H01J 2237/3321; H01J 37/32009
   See application file for complete search history.

(56) References Cited

U.S. PATENT DOCUMENTS

| | | | |
|---|---|---|---|
| 7,050,147 B2 | 5/2006 | Compen | |
| 7,524,735 B1 | 4/2009 | Gauri et al. | |
| 8,228,487 B2 | 7/2012 | Rijpma et al. | |
| 2004/0055709 A1* | 3/2004 | Boyd, Jr. | B23Q 3/154 156/345.51 |
| 2004/0114124 A1 | 6/2004 | Hoeks et al. | |
| 2004/0207824 A1 | 10/2004 | Lof et al. | |
| 2005/0030512 A1 | 2/2005 | Zaal et al. | |
| 2005/0030515 A1 | 2/2005 | Ottens et al. | |
| 2005/0045106 A1 | 3/2005 | Boyd et al. | |
| 2005/0128459 A1 | 6/2005 | Zwet et al. | |
| 2005/0195382 A1 | 9/2005 | Ottens et al. | |
| 2005/0248746 A1 | 11/2005 | Zaal et al. | |
| 2006/0006340 A1 | 1/2006 | Compen | |
| 2006/0033898 A1 | 2/2006 | Cadee et al. | |
| 2006/0038968 A1 | 2/2006 | Kemper et al. | |
| 2007/0139855 A1 | 6/2007 | Van Mierlo et al. | |
| 2008/0024743 A1 | 1/2008 | Kruit et al. | |
| 2008/0212046 A1 | 9/2008 | Riepen et al. | |
| 2008/0280536 A1 | 11/2008 | Sasaki et al. | |
| 2009/0079525 A1 | 3/2009 | Sijben | |
| 2009/0207392 A1 | 8/2009 | Rijpma et al. | |
| 2009/0262318 A1 | 10/2009 | Van Den Dungen et al. | |
| 2009/0279060 A1 | 11/2009 | Direcks et al. | |
| 2009/0279062 A1 | 11/2009 | Direcks et al. | |
| 2010/0193501 A1 | 8/2010 | Zucker et al. | |
| 2010/0200901 A1 | 8/2010 | Kim | |
| 2011/0222032 A1 | 9/2011 | Ten Kate et al. | |
| 2011/0222033 A1 | 9/2011 | Ten Kate et al. | |
| 2012/0274920 A1 | 11/2012 | Bex et al. | |
| 2013/0094009 A1 | 4/2013 | Lafarre et al. | |
| 2013/0189802 A1 | 7/2013 | Tromp et al. | |

FOREIGN PATENT DOCUMENTS

| | | |
|---|---|---|
| JP | 2001-237303 | 8/2001 |
| JP | 2005-029401 | 2/2005 |
| JP | 2006-024954 | 1/2006 |
| JP | 2009-179507 | 8/2009 |
| JP | 2009-200486 | 9/2009 |
| KR | 2009-0008658 | 1/2009 |
| WO | 99/49504 | 9/1999 |
| WO | 2008/047886 | 4/2008 |
| WO | 2013/113568 | 8/2013 |
| WO | 2013/113569 | 8/2013 |
| WO | 2013/156236 | 10/2013 |

* cited by examiner

SUBSTRATE HOLDER, LITHOGRAPHIC APPARATUS, DEVICE MANUFACTURING METHOD, AND METHOD OF MANUFACTURING A SUBSTRATE HOLDER

This application is a continuation of U.S. patent application Ser. No. 13/323,520, filed on Dec. 12, 2011, which claims priority and benefit under 35 U.S.C. §119(e) to U.S. Provisional Patent Application No. 61/422,918, filed on Dec. 14, 2010. The content of each of the foregoing applications is incorporated herein in its entirety by reference.

FIELD

The present invention relates to a substrate holder, a lithographic apparatus, a device manufacturing method, and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burls or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. The purpose of this is to help prevent a particle (i.e. a contaminating particle such as a dust particle) which might be present on either the substrate table or substrate holder from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping may therefore be used. In electrostatic clamping, a potential difference is established between the substrate, or an electrode plated on its lower surface, and an electrode provided on the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate is separately clamped to the substrate holder.

It is desirable to provide one or more electronic components on the substrate holder. For example, it is desirable to provide one or more heaters on the substrate holder to enable localized control of the temperature of the substrate and substrate holder. It is desirable to provide one or more sensors, e.g. a temperature sensor to measure the local temperature of the substrate holder and/or substrate. It is desirable to provide an electrode for an electrostatic clamp on the substrate holder. Such components could be accommodated on the surface of the substrate holder between the burls. However, the surface of the substrate holder may be too rough to allow reliable formation of one or more electronic components thereon. The roughness of the surface of the substrate holder is due to the use of processes such as etching, laser ablation and electron beam machining to remove material to form the burls.

It is desirable to provide a substrate holder on which one or more electronic components, such as one or more thin-film components, can be reliably formed.

According to an aspect of the invention, there is provided a substrate holder for use in a lithographic apparatus, the substrate holder comprising: a main body having a surface; a plurality of burls projecting from the surface and having end surfaces to support a substrate; and a planarization layer provided on at least part of the main body surface.

According to an aspect of the invention, there is provided a lithographic apparatus, comprising: a support structure configured to support a patterning device; a projection system arranged to project a beam patterned by the patterning device onto a substrate; and a substrate holder arranged to hold the substrate, the substrate holder comprising: a main body having a surface, a plurality of burls projecting from the surface and having end surfaces to support a substrate, and a planarization layer provided on at least part of the main body surface.

According to an aspect of the invention, there is provided a device manufacturing method using a lithographic apparatus, the method comprising:

holding a substrate on a substrate holder, the substrate holder comprising: a main body having a surface, a plurality of burls projecting from the surface and having end surfaces to support a substrate, and a planarization layer provided on at least part of the main body surface; and projecting a beam patterned by a patterning device onto the substrate while held by the substrate holder.

According to an aspect of the invention, there is provided a method of manufacturing a substrate holder for use in a lithographic apparatus, the method comprising:

providing a main body having a surface and a plurality of burls projecting from the surface and having end surfaces to support a substrate; and forming a planarization layer on at least part of the main body surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
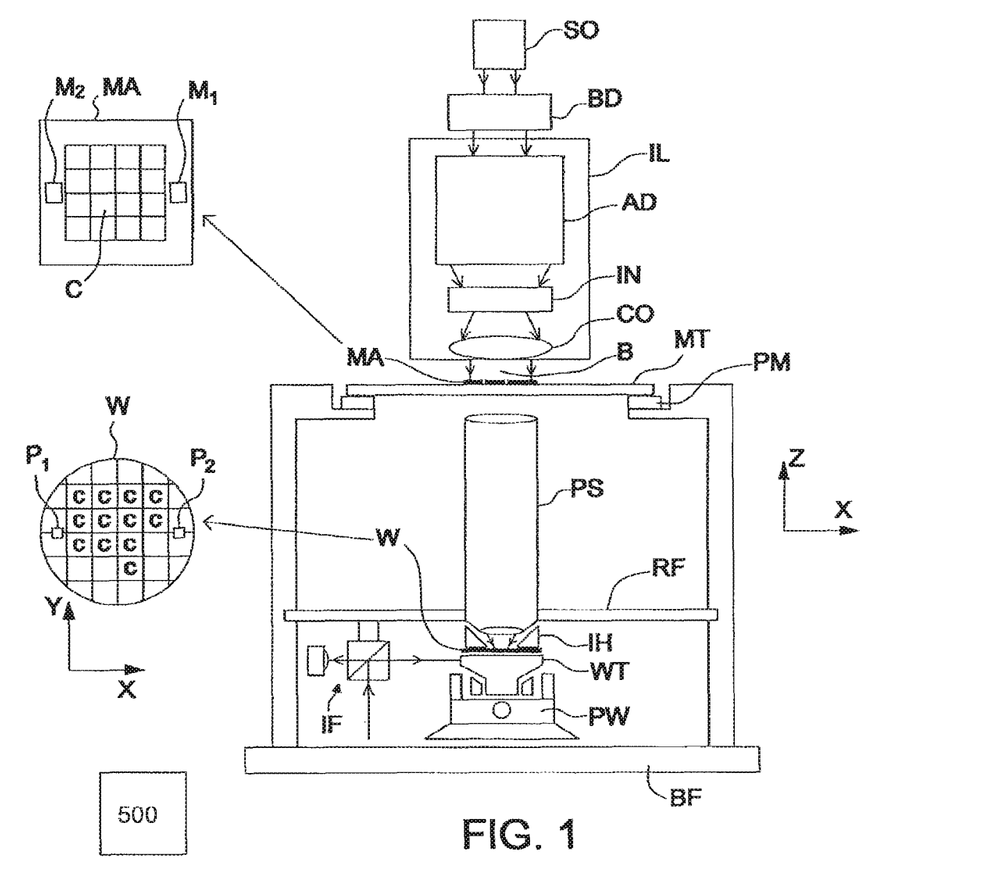
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid for example an immersion lithographic apparatus, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Anther arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Four different types of localized liquid supply systems are illustrated in FIGS. 2-5. Any of the liquid supply devices of FIGS. 2-5 may be used in an unconfined system; however, sealing features are not present, are not activated, are not as efficient as normal or are otherwise ineffective to seal liquid to only the localized area.

Figure 2:
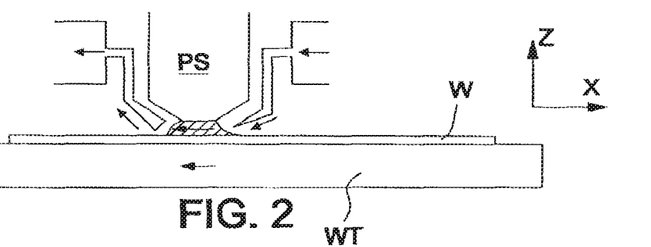
FIGS. 2 and 3 depict a liquid supply system for use in a lithographic projection apparatus.
Figure 3:
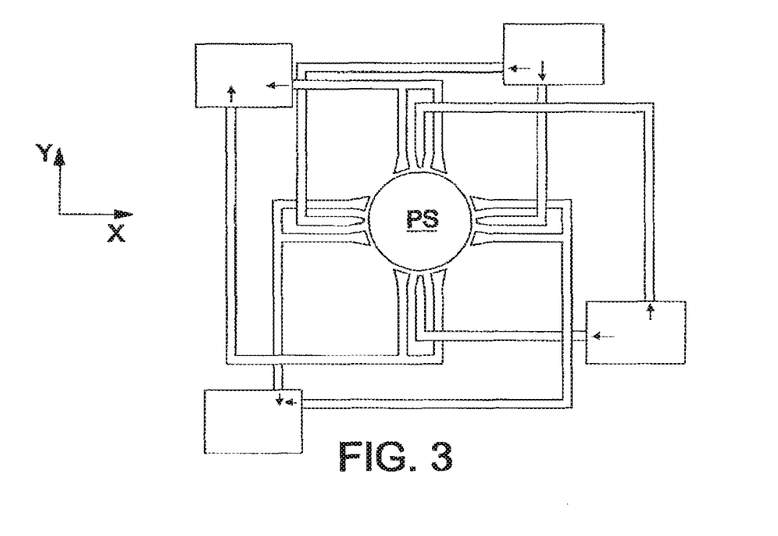

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
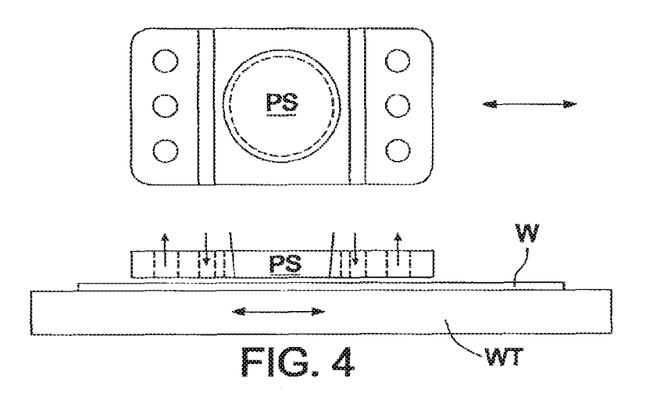
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Figure 5:
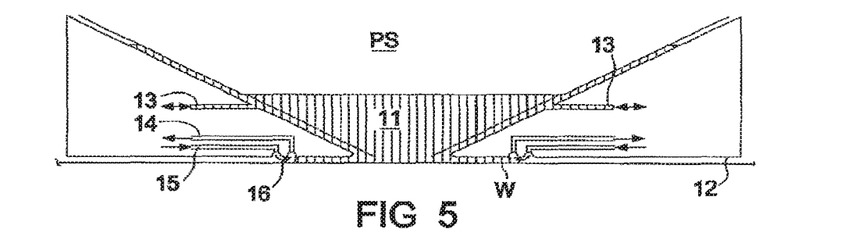
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication no. US 2008-0212046, United States patent application publication no. US 2009/0279060 and United States patent application publication no. US 2009/0279062. In that system the extraction holes are arranged in a shape which desirably has a corner. The corner may be aligned with the stepping or scanning directions. This reduces the force on the meniscus between two openings in the surface of the fluid handling structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 controls the overall operations of the lithographic apparatus and in particular performs an optimization process described further below. Control system 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
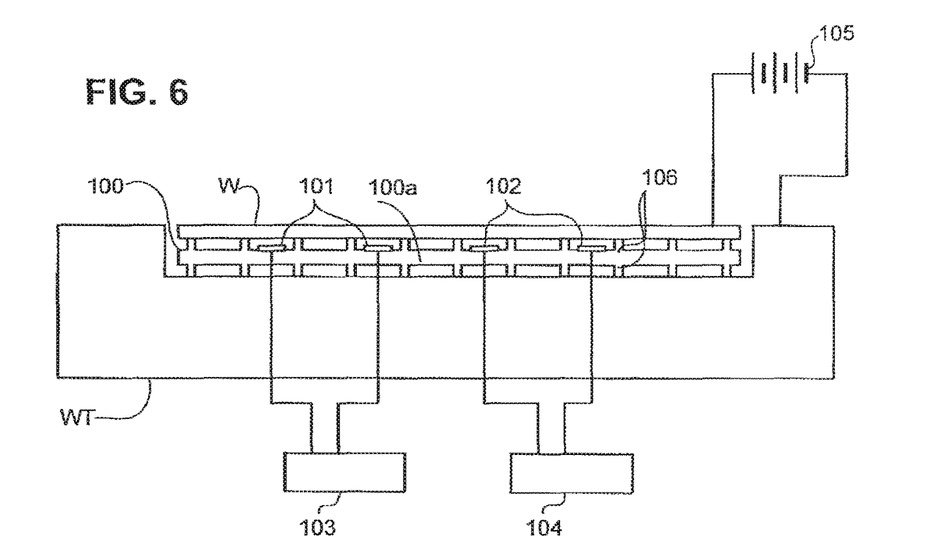
FIG. 6 depicts in cross-section a substrate table and a substrate holder according to an embodiment of the invention.

FIG. 6 depicts a substrate holder 100 according to an embodiment of the invention. It is held within a recess in substrate table WT and supports substrate W. The main body of the substrate holder 100A has the form of a flat disc substantially corresponding in shape and size to the substrate W. At least on a top side, in an embodiment on both sides, the substrate holder has projections 106, commonly referred to as burls. In an embodiment, the substrate holder is an integral part of the substrate table and does not have burls on the lower surface. The burls are not shown to scale in FIG. 6. In a practical embodiment, there can be many hundreds of burls distributed across a substrate holder of diameter, e.g., 300 mm. The tips of the burls have a small area, e.g. less than 1 mm², so that the total area of all of the burls on one side of the substrate holder 100 is less than about 1% of the total area of the total surface area of the substrate holder. In this way, there is a very high probability that any particle that might lie on the surface of the substrate, substrate holder or substrate table will fall between burls and will not therefore result in a deformation of the substrate or substrate holder. The arrangement of burls can be regular or can vary as desired to provide appropriate distribution of force on the substrate and substrate table. The burls can have any shape in plan but are commonly circular in plan. The burls can have the same shape and dimensions throughout their height but are commonly tapered. The burls can project a distance of from about 1 µm to about 5 mm, desirably from about 10 µm to about 1 µm, from the rest of the surface of the main body of the substrate holder 100A. The thickness of the main body 100A of the substrate holder 100 can be in the range of about 20 mm to about 50 mm.

In an embodiment of the invention, the substrate holder 100 is made of a non-conducting rigid material. A suitable material includes SiC (silicon carbide), SiSiC (siliconised silicon carbide), $Si_3N_4$ (silicon nitride), quartz, and/or various other ceramic and glass-ceramics, such as Zerodur™ glass ceramic. The substrate holder 100 can be manufactured by selectively removing material from a solid disc of the relevant material so as to leave the projecting burls. A suitable technique to remove material includes electrical discharge machining (EDM), etching and/or laser ablation. These techniques leave a rough surface, e.g. having a roughness value Ra of the order of several microns. The minimum roughness achievable with these removal techniques may derive from the material properties. For example, in the case of a two-phase material such as SiSiC, the minimum roughness achievable is determined by the grain size of the two-phase material. Such residual roughness causes difficulty in forming one or more electrical components, such as one or more thin film components, on the surface of the substrate and unreliability in such components. These problems may arise because the roughness causes gaps and cracks in thin layers coated or grown on the substrate holder to form an electronic component. A thin film component may have a layer thickness in the range of from about 2 nm to about 50 µm and may be formed by a process including chemical vapor deposition, physical vapor deposition (e.g. sputtering), dip coating, spin coating and/or spray coating.

An electronic component to be formed on the substrate table can include, for example, an electrode, a resistive heater and/or a sensor, such as a strain sensor, a magnetic sensor, a pressure sensor or a temperature sensor. A heater and sensor can be used to locally control and/or monitor the temperature of the substrate holder and/or substrate so as to reduce undesired or induced desired temperature variation and stress in the substrate holder or substrate. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g., water) on the substrate may cause localized cooling and hence shrinkage of the substrate. Conversely, the energy delivered to the substrate by the projection beam during exposure can cause significant heating and therefore expansion of the substrate.

In an embodiment, the component to be formed is an electrode for an electrostatic clamp. In electrostatic clamping, a potential difference is established between the substrate, or an electrode plated on its lower surface, and an electrode provided on the substrate table and/or substrate holder. The two electrodes behave as a large capacitor and substantial clamping forces can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate separately clamped to the substrate holder.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. Voltage source 105 generates a potential difference e.g. of the order of 10 to 100 volts, between the substrate W and substrate table WT so that an electrostatic force clamps the substrate W, substrate holder 100 and substrate table WT together. In an embodiment, the potential difference is provided between an electrode on the lower surface of the substrate W and an electrode on the bottom of the recess in the substrate table WT. Arrangements using one or more heaters and temperature sensors to locally control the temperature of a substrate are described in U.S. patent application publication nos. US 2011/0222032 and US 2011/0222033, which documents are incorporated herein by reference in their entirety. The arrangements described therein can be modified to make use of a resistive heater and temperature sensor as described herein.

Figure 7:
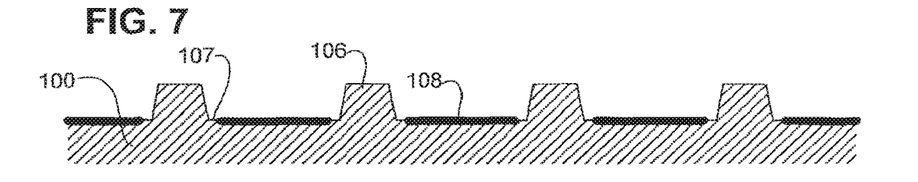
FIG. 7 is an enlarged view of a part of the substrate holder of FIG. 6.
Figure 8:
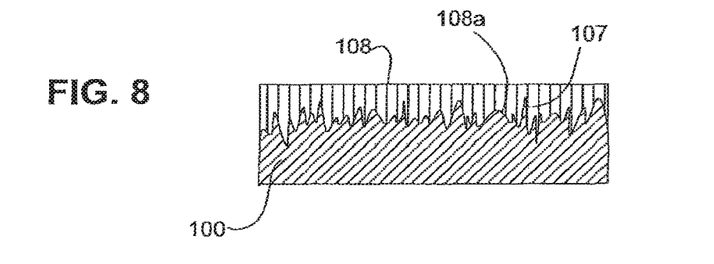
FIG. 8 is a further enlarged view of a part of the substrate holder of FIGS. 6 and 7.

FIG. 7 is an enlargement of part of the substrate holder 100 of FIG. 6 showing the upper surface 107 and some burls 106 in cross-section. In an embodiment of the invention, a planarization layer 108 is provided on the upper surface 107 in at least some areas between the burls 106. In an embodiment, the planarization layer can be provided only where an electronic component is to be formed or across substantially the entire upper surface of the substrate holder 100. FIG. 8 shows a further enlargement of the planarization layer 108. As can be seen, the planarization layer fills in roughnesses of the upper surface 107 and provides an upper surface 108a that is substantially smoother than the surface 107. In an embodiment of the invention the roughness Ra of the surface 108a is less than about 1.5 µm, desirably less than about 1 µm, or desirably less than about 0.5 µm.

In an embodiment, the planarization layer 108 is formed by applying a plurality, e.g. two, layers of coating material or precursor material. In an embodiment the planarization layer 108 is formed by applying a single layer of coating material or precursor material. Depending upon the material of the planarization layer it can be possible to determine from inspection of the formed coating that it has been applied by forming multiple sub-layers. In an embodiment, the multiple sub-layers of the planarization layer 108 are formed of the same material. In an embodiment, the multiple sub-layers of the planarization layer 108 are formed of different materials.

In an embodiment, the planarization layer 108 is formed of a silicon oxide or silicon nitride-based compound with a functional group attached to each Si atom. The functional groups can be selected from the group consisting of hydrogen, methyl, fluoro, vinyl and the like. Such materials are disclosed in U.S. Pat. No. 7,524,735, which document is incorporated herein in its entirety by reference. The precursor of the dielectric material may include one of more of the following compounds: triethoxysilane (TES), tetraethyl orthosilicate or tetra-ethoxy-silane (TEOS), tetramethoxysilane (TMOS), methyl triethoxysilane (MTEOS), methyltrimethoxysilane (MTMOS), dimethyldimethoxysilane (DMDMOS), trimethylmethoxysilane (TMMOS), dimethyldiethoxysilane (DMDEOS), bis-triethoxysilylethane (BTEOSE) or bis-triethoxysilylmethane (BTEOSM), tetramethylcyclotetrasiloxane (TMCTS), octamethylcyclotetrasiloxane (OMCTS), and/or tetravinyltetramethylcyclotetrasiloxane (TVTMCTS). In certain embodiments, the dielectric precursor is mixed in a carrier solvent, e.g., an alcohol. In an embodiment, the planarization layer 108 is formed of $Si(CH_3)_2O_x$ which may be formed from an organic precursor. In an embodiment the planarization layer is formed of $SiOx$, e.g. $SiO_2$. In an embodiment the planarization layer is formed of an organic monomer (i.e. carbon-based material) such as benzocyclobutene (BCB). Other suitable materials include another oxide such as aluminum oxide and/or titanium oxide. Such oxides are desirably non conductive. Such an oxide layer may be formed from an organic pre-cursor. A method of applying such a material is described in U.S. Pat. No. 7,524,735, which document is incorporated herein in its entirety by reference. In an embodiment the planarization layer is formed of polymer chains consisting of $Si(CH_3)_2N$ and $Si(CH_3)_2O$ backbones. Methods of applying the planarization layer include one or more coating techniques selected from: deep-coating, spin coating, spray-coating and/or a deposition technique for example in a gaseous environment such as air or in a vacuum.

The planarization layer may have a thickness in the range of from about 0.2 µm to about 200 µm, desirably from about 2 µm to about 20 µm. In an embodiment the planarization layer is about 10 µm. The thickness of the planarization layer is the thickness of such a coating as determined by the same volume of coating applied to a substrate of silicon, e.g. a silicon wafer used in the lithographic apparatus. The planarization layer is desirably sufficiently thick to fill-in most or all of the roughnesses of the surface of the substrate holder. If the planarization layer is too thick, it is more likely to crack during curing Applying the planarization layer in a plurality of separate coats, as described below, can reduce the chance of such cracking and reduce the surface roughness of the final layer.

Figure 16:
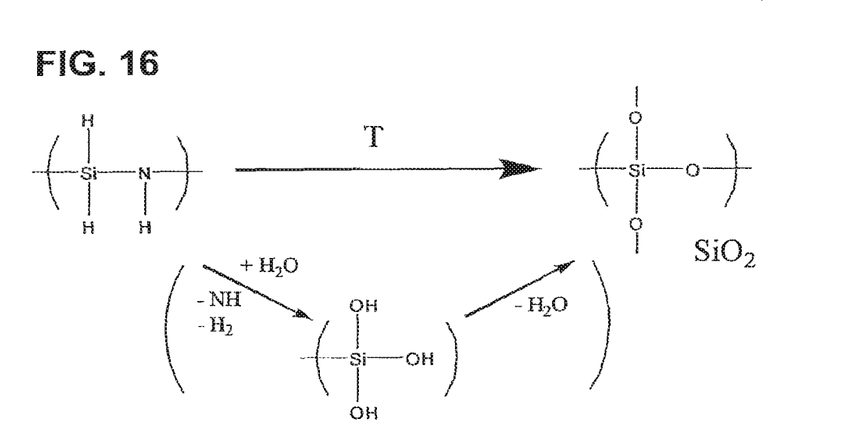
FIGS. 16 to 19 depict chemical reactions in formation of planarization layers in embodiments of the invention. Note that conversion of a polysilazane with chains of —Si—N— backbones to Si—O— backbones may not complete, i.e. reach 100%. A resulting planarization layer after curing may have a low concentration of —Si—N— chains.
Figure 17:
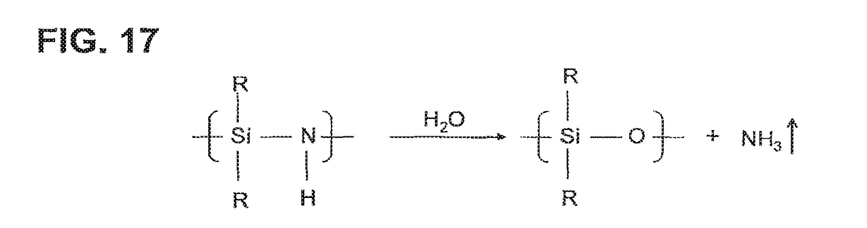
Figure 18:
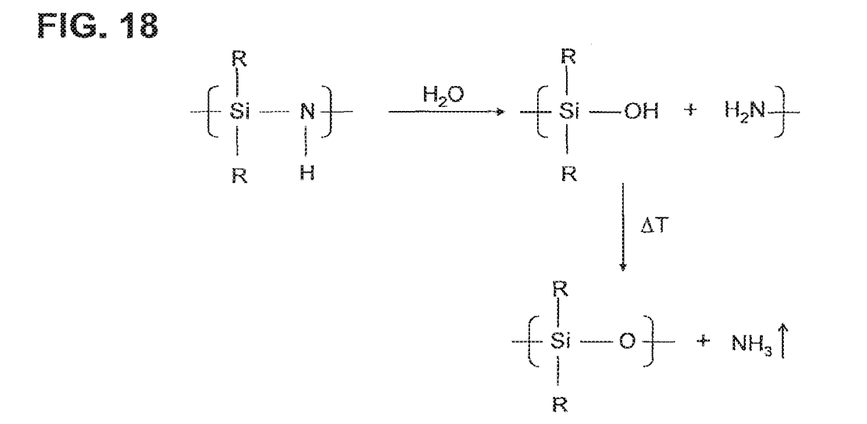
Figure 19:
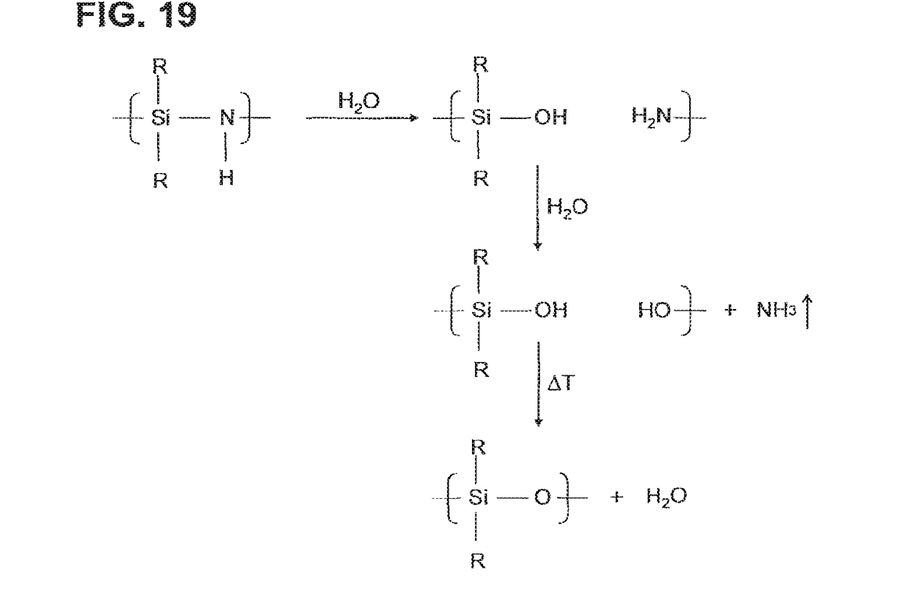

In an embodiment, the planarization layer is applied by coating the substrate holder 100 with a polysilazane solution which is then cured to form the silicon-based planarization layer. The reaction involved is shown in FIG. 16. In an embodiment, the polysilazane solution is applied by a spray technique. Additionally or alternatively, other techniques such as spin coating can be used. FIGS. 17 to 19 depict other reactions that can be used to form planarization layers in embodiments of the invention. FIG. 17 depicts a reaction that proceeds via an aqueous medium alone. FIG. 18 depicts a reaction that proceeds in an aqueous medium in the presence of heat. FIG. 19 depicts another reaction that proceeds in an aqueous medium in the presence of heat. In each of FIGS. 17 to 19, R depicts a functional group selected from the group consisting of hydrogen, methyl, fluoro. Note that in the chemical reactions in FIGS. 16 to 19 the conversion of polysilazane with chains of —Si—N— backbones to Si—O-backbones may not complete, i.e. reach 100%. A resulting planarization layer after curing may have a low concentration of —Si—N— chains.

The planarization layer provides a surface that is sufficiently smooth for reliable formation of one or more metal or other layers to form a thin film component. In particular, glass bonding steps that may be required with some materials used to form a substrate holder may be unnecessary.

Figure 9:
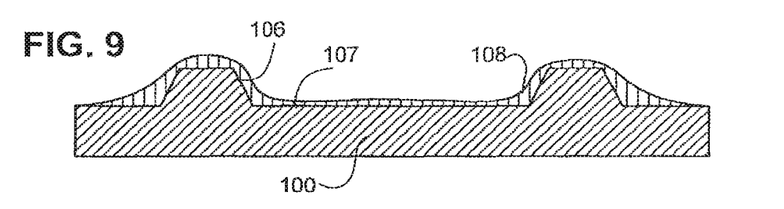
FIGS. 9 and 10 depict steps in a method of manufacturing a substrate holder according to an embodiment of the invention.
Figure 10:
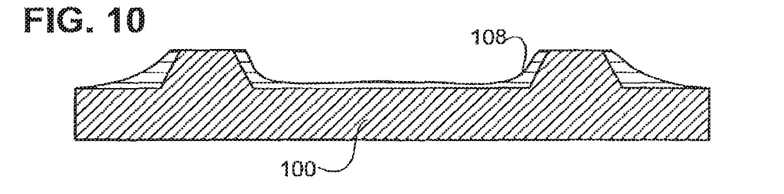
Figure 11:
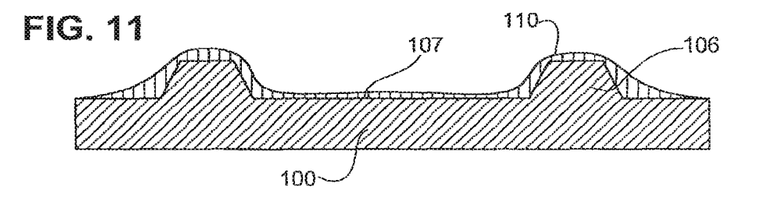
FIGS. 11 to 14 depict steps in a method of manufacturing a substrate holder according to an embodiment of the invention.

FIGS. 9 and 10 illustrate steps in an embodiment of a method of applying the planarization layer 108. As shown in FIG. 9, the polysilazane solution is sprayed across the upper surface 107 of the substrate holder 100 and cured to form a continuous layer 108. This layer initially covers the burls 106 as well as the spaces between them. In a second step, the result of which is shown in FIG. 10, the planarization layer 108 is removed from the top of the burls 106. This removal step can be performed using a known technique, such as machining (lapping or polishing), a chemical process (such as etching) with a laser and/or chemical mechanical polishing (CMP). This method has an advantage that it is quick, involving only two steps.

Figure 12:
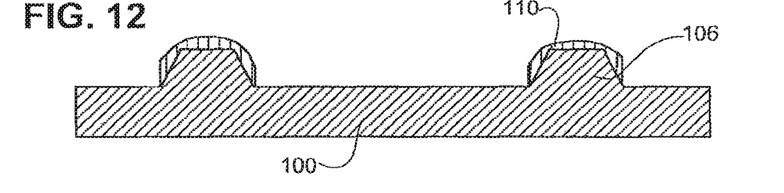
Figure 13:
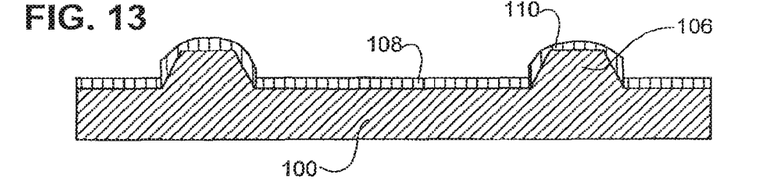
Figure 14:
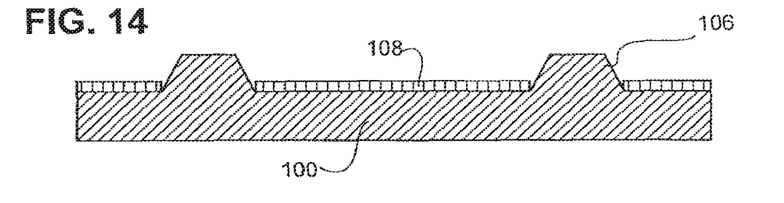

FIGS. 11 to 14 illustrate steps in a further embodiment of a method applying the planarization layer 108. In this method, a photoresist 110 is applied to the whole of the upper surface 107 of the substrate holder 100. The photoresist is then selectively exposed and the exposed or unexposed photoresist, depending on whether the photoresist is positive or negative, is removed, so that photoresist 110 remains only covering the burls 106 as shown in FIG. 12. In an embodiment the photoresist possess an antiwetting function in order to guide the planarization material onto the surface between the burls 106. Planarization material 108 is then applied, as shown in FIG. 13. Finally, the remaining photoresist is removed to leave planarization material 108 only in the spaces between the burls 106.

Figure 15:
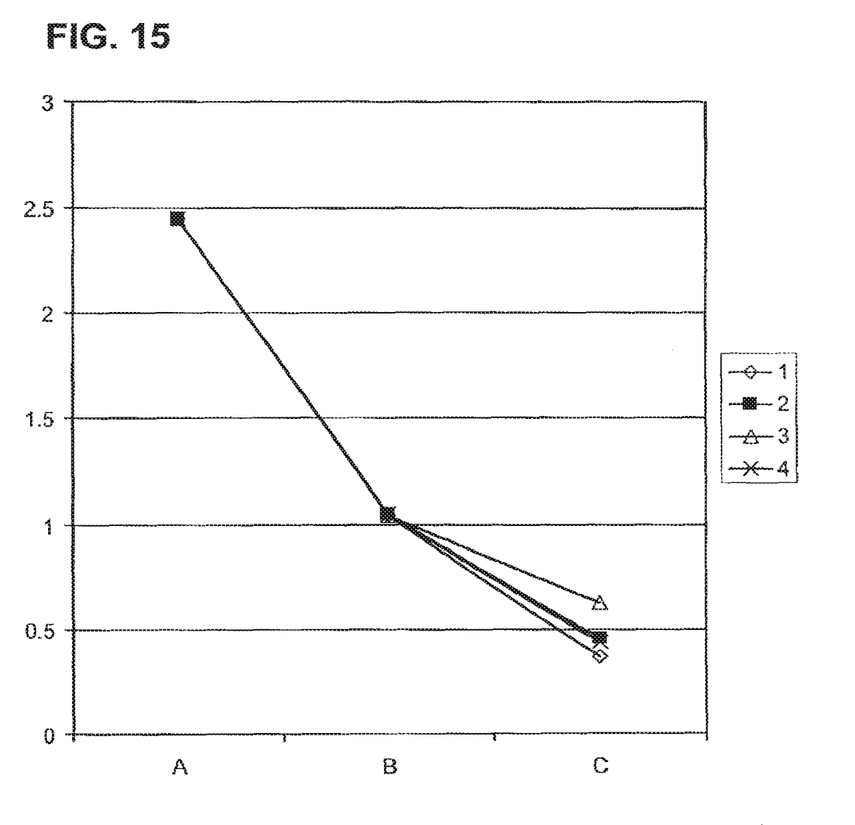
FIG. 15 is a graph depicting surface roughness of some examples of an embodiment of the invention.

In both of the above methods, the planarization layer 108 can be applied in multiple coating steps in order to reduce the surface roughness. FIG. 15 is a graph showing roughness values Ra in µm for planarization layers of four samples, numbered 1 to 4, of substrate holders according to an embodiment of the present invention. The substrate holder was of a SiSiC material and as shown as A in FIG. 5 had a surface roughness Ra prior to any coating or other treatment of 2.45 µm. The samples were then spray coated with a polysilazane solution (CAG 37 obtained from Clariant Advanced Materials GmbH) and allowed to dry. In the case of samples 1 and 3, the amount of solution applied was sufficient to achieve a layer thickness of 2.4 µm. In the case of samples 2 and 4 a greater amount was applied to achieve a layer thickness of 4 µm. After curing, the surface roughness Ra of samples 1 and 3 was measured at 1.04 µm and that of samples 2 and 4 as 1.05 µm, as shown at B in FIG. 15.

Before a second layer was applied, the first layers were hydrophillised by exposing them to air plasma for approximately 1 minute. This step can be omitted if only a single layer is to be applied or if the material applied is not hydrophobic. The amounts of material applied to form the second layer were varied. Samples 1 and 2 had an amount of solution applied to form a coating of 2.4 µm while samples 3 and 4 had an amount of solution applied to form a coating of thickness 4 µm. After curing of the second coating, the roughness Ra values of samples 1 to 4 were measured respectively at 0.37 µm, 0.46 µm, 0.63 µm and 0.44 µm, as shown at C in FIG. 15. From these results, an improved surface roughness may be achieved by a two-step coating technique and it may be desirable that the thickness of a second coating layer is not greater than the thickness of a first applied coating layer.

Layer thicknesses and measured roughnesses are shown in the following table:

| Sample: | 1 | 2 | 3 | 4 |
| --- | --- | --- | --- | --- |
| 1st Coating Thickness (µm) | 2.4 | 4 | 2.4 | 4 |
| 2nd Coating Thickness (µm) | 2.4 | 2.4 | 4 | 4 |
| Uncoated Roughness Ra (µm) | 2.45 | 2.45 | 2.45 | 2.45 |
| Roughness Ra (µm) after one coat | 1.04 | 1.05 | 1.04 | 1.05 |
| Roughness Ra (µm) after two coats | 0.37 | 0.46 | 0.63 | 0.44 |

Roughness values given above where obtained using a Taylor Hobson stylus profiler having a diamond tip of radius 2 µm, which is scanned over the layer to measure its profile and Ra is estimated from the contour map. Other equivalent instruments and methods can be used instead.

As will be appreciated, any of the above described features can be used with any other feature and it is not only those combinations explicitly described which are covered in this application.

In an embodiment, there is provided a substrate holder for use in a lithographic apparatus, the substrate holder comprising: a main body having a surface; a plurality of burls projecting from the surface and having end surfaces to support a substrate; and a planarization layer provided on at least part of the main body surface.

In an embodiment, the planarization layer has a surface roughness Ra less than about 1.5 µm, less than about 1.0 µm, or less than about 0.5 µm. In an embodiment, the planarization layer is formed of a silicon-based material, for example formed from an organic precursor. In an embodiment, the planarization layer is formed of a silicon oxide or silicon nitride based material. In an embodiment, the planarization layer includes a functional group selected from the group consisting of: hydrogen, methyl, fluoro, vinyl and the like. In an embodiment, the planarization layer is formed of an carbon-based material such as benzocyclobutene. In an embodiment, the main body is formed of a material selected from the group consisting of: SiC (silicon carbide), SiSiC (siliconised silicon carbide), $Si_3N_4$ (silicon nitrite), quartz, and Zerodur™ glass ceramic. In an embodiment, the planarization layer is formed of a plurality of separately formed sub-layers. In an embodiment, the planarization layer has a thickness in the range of from about 0.2 µm to about 200 µm. In an embodiment, the planarization layer does not cover at least the end surfaces of the burls. In an embodiment, the burls have side surfaces and the planarization layer does not cover at least part of the side surfaces of the burls, desirably does not cover all of the side surfaces of the burls. In an embodiment, the substrate holder further comprises an electronic component provided on the planarization layer. In an embodiment, the electronic component is a thin-film component. In an embodiment, the electronic component is a component selected from the group consisting of: an electrode, a heater, and a sensor. In an embodiment, the electrode is, in use, an electrode of an electrostatic clamp.

In an embodiment, there is provided a lithographic apparatus, comprising: a support structure configured to support a patterning device; a projection system arranged to project a beam patterned by the patterning device onto a substrate; and a substrate holder arranged to hold the substrate, the substrate holder comprising: a main body having a surface, a plurality of burls projecting from the surface and having end surfaces to support a substrate, and a planarization layer provided on at least part of the main body surface.

In an embodiment, the planarization layer has a surface roughness Ra less than about 1.5 µm, less than about 1.0 µm, or less than about 0.5 µm. In an embodiment, the planarization layer is formed of a silicon-based material. In an embodiment, the planarization layer is formed of a silicon oxide or silicon nitride based material. In an embodiment, the planarization layer includes a functional group selected from the group consisting of: hydrogen, methyl, fluoro, vinyl and the like. In an embodiment, the planarization layer is formed of benzocyclobutene. In an embodiment, the main body is formed of a material selected from the group consisting of: SiC (silicon carbide), SiSiC (siliconised silicon carbide), $Si_3N_4$ (silicon nitrite), quartz, and Zerodur™ glass ceramic. In an embodiment, the planarization layer is formed of one or more of separately formed sub-layers. In an embodiment, the planarization layer has a thickness in the range of from about 0.2 µm to about 200 µm. In an embodiment, the planarization layer does not cover at least the end surfaces of the burls. In an embodiment, the burls have side surfaces and the planarization layer does not cover at least part of the side surfaces of the burls, desirably does not cover all of the side surfaces of the burls. In an embodiment, the lithographic apparatus further comprises an electronic component provided on the planarization layer. In an embodiment, the electronic component is a thin-film component. In an embodiment, the electronic component is a component selected from the group consisting of: an electrode, a heater, and a sensor. In an embodiment, the electrode is, in use, an electrode of an electrostatic clamp. In an embodiment, the lithographic apparatus further comprises a substrate table and wherein the substrate holder is integrated into the substrate table.

In an embodiment, there is provided a device manufacturing method using a lithographic apparatus, method comprising: projecting a beam patterned by a patterning means onto a substrate; whilst holding a substrate in a substrate holder; wherein the substrate holder comprising: a main body having a surface; plurality of burls projecting from the surface and having end surfaces for supporting a substrate; and a planarization layer provided on at least part of the main body surface.

In an embodiment, there is provided a method of manufacturing a substrate holder for use in a lithographic apparatus, the method comprising: providing a main body having a surface and a plurality of burls projecting from the surface and having end surfaces to support a substrate; and forming a planarization layer on at least part of the main body surface.

In an embodiment, the planarization layer is formed so as to have a surface roughness Ra less than about 1.5 µm, less than about 1.0 µm, or less than about 0.5 µm. In an embodiment, the planarization layer is formed of a silicon-based material. In an embodiment, the planarization layer is formed of a silicon oxide or silicon nitride based material. In an embodiment, the planarization layer includes a functional group selected from the group consisting of: hydrogen, methyl, fluoro, vinyl and the like. In an embodiment, the planarization layer is formed of benzocyclobutene. In an embodiment, the main body is formed of a material selected from the group consisting of SiC (silicon carbide), SiSiC (siliconised silicon carbide), $Si_3N_4$ (silicon nitrite), quartz, and Zerodur™ glass ceramic. In an embodiment, the planarization layer is formed of one or more of separately formed sub-layers. In an embodiment, the planarization layer has a thickness in the range of from about 0.2 µm to about 200 µm. In an embodiment, the planarization layer does not cover at least the end surfaces of the burls. In an embodiment, the burls have side surfaces and the planarization layer does not cover at least part of the side surfaces of the burls, desirably does not cover all of the side surfaces of the burls. In an embodiment, the method further comprises an electronic component provided on the planarization layer. In an embodiment, the electronic component is a thin-film component. In an embodiment, the electronic component is a component selected from the group consisting of: an electrode, a heater, and a sensor. In an embodiment, the electrode is, in use, an electrode of an electrostatic clamp. In an embodiment, wherein the providing the main body having a plurality of burls comprises providing a blank and removing material from the blank to leave the projecting burls. In an embodiment, the removing material is performed by a method selected from the group consisting of: electrical discharge machining, laser ablation, and etching. In an embodiment, the forming a planarization layer comprises applying a solution of polysilazane to the main body and curing the solution to form the planarization layer.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A method of manufacturing a substrate holder for use in a lithographic apparatus, the method comprising:
providing a main body having a surface and a plurality of burls projecting from the surface and having end surfaces to support a substrate;
applying a planarization layer on the surface of the main body and the burls so as to form a continuous layer, wherein the planarization layer comprises a first surface and a second surface opposite the first surface, wherein the first surface of the planarization layer fills in roughness of the surface of the main body between the burls and the surface roughness of the second surface is less than the surface roughness of the first surface;
removing a part of the planarization layer from the end surfaces of the burls such that the planarization layer is arranged on at least part of the surface of the main body and not covering at least the end surfaces of the burls; and
forming an electrical component on the planarization layer.

2. The method of claim 1, wherein removing the part of the planarization layer from the end surfaces of the burls is performed using machining, a chemical process with a laser, and/or chemical mechanical polishing.

3. The method of claim 1, wherein the applying the planarization layer comprises applying a solution of a polymer or polymer-precursor.

4. The method of claim 1, wherein the applying the planarization layer comprises applying a first sub-layer and separately applying a second sub-layer onto the first sub-layer.

5. The method of claim 4, wherein the second sub-layer has a different composition than the first sub-layer.

6. The method of claim 4, wherein the second sub-layer has a thickness less than or equal to the thickness of the first sub-layer.

7. The method of claim 1, wherein the applying the planarization layer comprises applying a first sub-layer, baking the first sub-layer to cure it, and applying a second sub-layer on the first sub-layer.

8. The method of claim 1, wherein the electrical component comprises a thin film stack forming an electronic component.

9. The method of claim 1, wherein the electrical component is an electrode of an electrostatic clamping system.

10. The method of claim 1, wherein applying the planarization layer comprises applying a polysilazane solution to the main body.

11. The method of claim 1, wherein the planarization layer has a thickness of 200 microns or less.

12. A method of manufacturing a substrate holder, the method comprising:
providing a main body having a surface and a plurality of burls projecting from the surface and having end surfaces to support a substrate;
forming a layer of resist which covers only the burls;
applying a planarization layer on the surface of the main body so as to form a continuous layer; and
removing the layer of resist from the burls such that the planarization layer is arranged on at least part of the main body surface and not covering at least the end surfaces of the burls.

13. The method of claim 12, wherein the resist has an anti-wetting property.

14. The method of claim 12, wherein the applying the planarization layer comprises applying a solution of a polymer or polymer-precursor.

15. The method of claim 12, wherein the applying the planarization layer comprises applying a first sub-layer and a second sub-layer, the second sub-layer having a different composition than the first sub-layer.

16. The method of claim 12, wherein the applying the planarization layer comprises applying a first sub-layer, baking the first sub-layer to cure it, and applying a second sub-layer on the first sub-layer.

17. The method of claim 12, further comprising forming an electrical component on the planarization layer.

18. The method of claim 17, wherein the electrical component comprises a thin film stack forming an electronic component.

19. The method of claim 17, wherein the electrical component is an electrode of an electrostatic clamping system.

20. The method of claim 12, wherein the planarization layer comprises a first surface and a second surface opposite the first surface, wherein the first surface of the planarization layer fills in roughness of the surface of the main body between the burls and the surface roughness Ra of the second surface is less than the surface roughness Ra of the first surface.

* * * * *